United States Patent [19]

De

[11] Patent Number: 5,075,283
[45] Date of Patent: Dec. 24, 1991

[54] HIGH-$T_c$ SUPERCONDUCTOR QUANTUM INTERFERENCE DEVICES

[75] Inventor: Dilip K. De, Winston-Salem, N.C.

[73] Assignee: International Superconductor Corp., Riverdale, N.Y.

[21] Appl. No.: 321,262

[22] Filed: Mar. 9, 1989

[51] Int. Cl.[5] .................................................. B32B 9/00
[52] U.S. Cl. ........................................ 505/1; 505/701; 505/702; 505/703; 505/704; 428/195; 428/426; 428/432; 428/433; 428/688; 428/901; 428/930
[58] Field of Search ............................ 505/1, 701–704; 428/426, 432, 433, 688, 901, 930, 195

[56] References Cited
U.S. PATENT DOCUMENTS 4,897,378  1/1990  Chiang ..................................... 505/1

OTHER PUBLICATIONS

CA 110 (24):223599t, Betts et al, 1989, High $T_c$ Thin Film and Device Development.
Jap. Abs. 88347919/49, SC Oxide Thin Films, Sumitomo Elec.
Vapor Deposited High $T_c$ Superconducting Oxide Thin Films, Laibowitz Amer. Inst. Phys. Conf. Proc. No. 165, 11-6-87.

Primary Examiner—Patrick J. Ryan
Attorney, Agent, or Firm—Herbert Dubno

[57] ABSTRACT

High $T_c$ superconductor quantum interferometric devices are disclosed. Such devices are especially suited for detecting small changes and spatial variation in magnetic field. Such detection finds important application in NDE evaluation of metals, in the evaulation of magnetic susceptibilities and in magnetic resonance spectrometers.

4 Claims, 6 Drawing Sheets

HIGH-$T_c$ SUPERCONDUCTOR QUANTUM INTERFERENCE DEVICES

FIELD OF INVENTION

This invention relates to superconducting quantum interferometric devices.

BACKGROUND OF INVENTION

Superconductor quantum interference devices (SQUIDs) are sensitive devices especially suited for detecting small changes and spatial variation in magnetic fields. This feature of said devices finds wide application in medical research, magnetometers (for accurate measurement of magnetic susceptibility), and geophysical laboratories. SQUIDs can be of two kinds rf and dc. The former consists of a single superconductor-insulator superconductor junction in a loop. The latter consists of two similar such junctions in a loop.

Superconductivity was originally discovered by the Dutch scientist Heike Onnes in 1911 while he was studying the electrical properties of mercury at very low temperatures. In more recent times, Ogg (1946) studied superconductivity in ammonia solutions and proposed that superconductivity arose in these quenched metal-ammonia solutions because of mobile electron pairs. About 1973, it was determined that certain niobium metal alloys exhibited superconductivity when cooled to liquid helium (4 K.) temperatures. Later results in the 1970's raised this temperature as high as 23 K. ($-250°$ C.). Until recently, it was believed that superconductivity above this temperature was not possible. This belief was based on the theoretical work of Bardeen, Cooper and Schieffer (BCS theory-1946) which predicted such a limit. In December 1986, Bednorz and Mller announced the discovery (G. Bednorz and A. Mller, Z. Phys., B64 189 (1986)) of a new ceramic superconducting compound based on lanthanum, barium, and copper oxides, whose critical temperature for superconductivity was close to 35 K. By the following month, the critical temperature, $T_c$, for the onset of superconductivity was raised to nearly 80 K. by C. W. Chu and coworkers (M. K. Wu, J. R. Ashburn, C. J. Tang, P. H. Hor, R. L. Meng, L. Gao, Z. J. Huang, Y. Q. Wang and C. W. Chu, Phys. Rev. Lett. 58 908 (1987)). This was achieved by changing the composition to yttrium barium copper oxide, approximated by the formula: $Y_{1.0}Ba_{1.8}Cu_{3.0}O_{6.3}$ Since then, a number of families of superconducting ceramic oxides have been investigated, including:

Bismuth Strontium Calcium Copper Oxide:
$T_c = 114$ K.
Thallium Calcium (Barium) Copper Oxide:
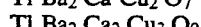
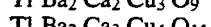
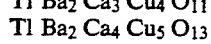
$T_c = 120$ K.
$T_c = 30$ K.

There have been some scattered reports of superconductivity above 162 K., For instance, R. G. Kulkarui has reported superconducting oxides having an approximate composition $0.5CaO. 0.5ZnO. Fe_2O_4$, with critical temperatures in this range. Ogushi also reported superconductivity at room temperature in yet ill-defined niobium strontium lanthanum oxides. While these reports have yet to be confirmed independently by other researchers, it is reasonable to expect that superconductors with critical temperaures near to room temperature will soon be obtained.

Niobium-based superconducting alloy wires have long been been used for detecting small changes in magnetic field strength. In the prior art, superconductor quantum interference devices have typically been made of Nb-Sn or similar low temperature superconductors that operate at liquid H2 temperatures. With the discovery of high-$T_c$ superconductors and high-$T_c$ superconducting thin films, high-$T_c$ superconducting superconductor quantum interference devices also find application in non-destructive evaluation of materials, especially metals.

I have determined that the use of superconductor quantum interference devices to measure changes in magnetic field strength produces results much superior to any known heretofore, especially when said devices are used in conjunction with modulated high frequency exciting currents.

OBJECTS OF THE INVENTION

Therefore, an object of this invention is to provide high-$T_c$ superconductor quantum interference devices capable of measuring magnetic field strengths.

Another object is to provide a method of employing superconductor quantum interference devices to measure magnetic field strengths at sensitivities not heretofore possible.

Still another object is to provide methods of evaluating magnetic field strengths which are much easier to apply and which produce results not possible before.

A final object is to provide designs of apparatus capable of employing superconductor quantum interference devices to measure and evaluate magnetic field strengths in selected applications, including magnetic suceptibility and nuclear magnetic resonance.

BRIEF DESCRIPTION THE DRAWING

The accompanying drawing illustrates specific embodiments of my invention and the accompanying description may be taken as Examples of the instant invention:

SPECIFIC DESCRIPTION

Figure 1:
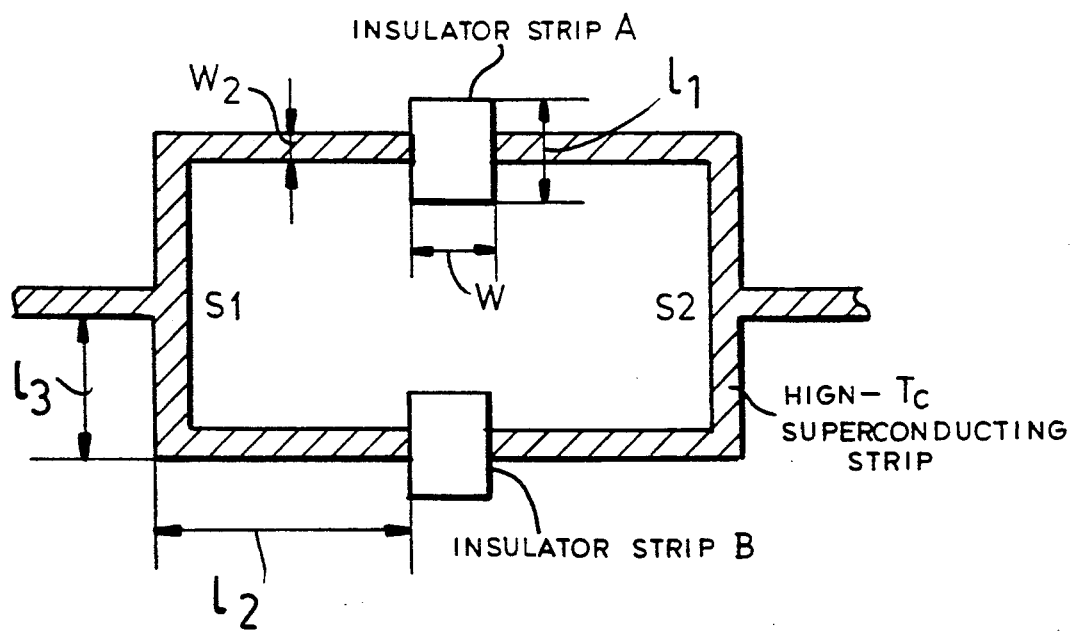
FIG. 1 is a diagram showing a SQUID according to the invention.

With reference to FIG. 1, the design of a structure incorporating a basic superconductor quantum interference device is illustrated. Two identical right angled superconducting thin film strips S1 and S2 are joined by identical thin film strips A and B of an insulating material to form a loop. The loop could be circular as well. The width, W1, of the insulator strip determines the minimum magnetic field strength which can be measured. Changes in said width are dictated by the particular application for which the superconductor quantum interference device is intended. For example, with a junction width of 0.5 mm the precisely determinable magnetic field, and changes therein measurable, is about 15 mG. The junction width can be made much smaller than 0.5 mm. The smaller the junction width W prepared, the smaller is the magnetic field strength that can be precisely determined and it is according to the relation:

$$BWT/2L_o = s$$

$L_o$ is the flux quantum and is $2 \times 10^{-7}$ Gauss cm$^2$, where T is the junction thickness and s is an integer.

Thus, in the instant invention, the magnetic field strengths that I am able to precisely measure depend solely upon the width W and the thickness of the junction I am able to achieve. Though low temperature SQUIDs using conventional niobium superconductors such as NbT$_i$ or Nb$_3$Sn have been used before such measurements always require expensive liquid helium and therefore such uses are limited. Since the fabrication of high-T$_c$ superconductors and and the fabrication of corresponding microstrip lines are quite different from that of Niobium superconductors new techniques ought to be invented for fabricating high-T$_c$ superconducting SQUIDs. For an rf SQUID the second insulating junction B can be omitted.

So far fabrication of high-T$_c$ SQUIDs have met little success.

I have invented two separate methods such that high-T$_c$ SQUIDs can be fabricated efficiently and time-cost effectively.

Figure 2A:
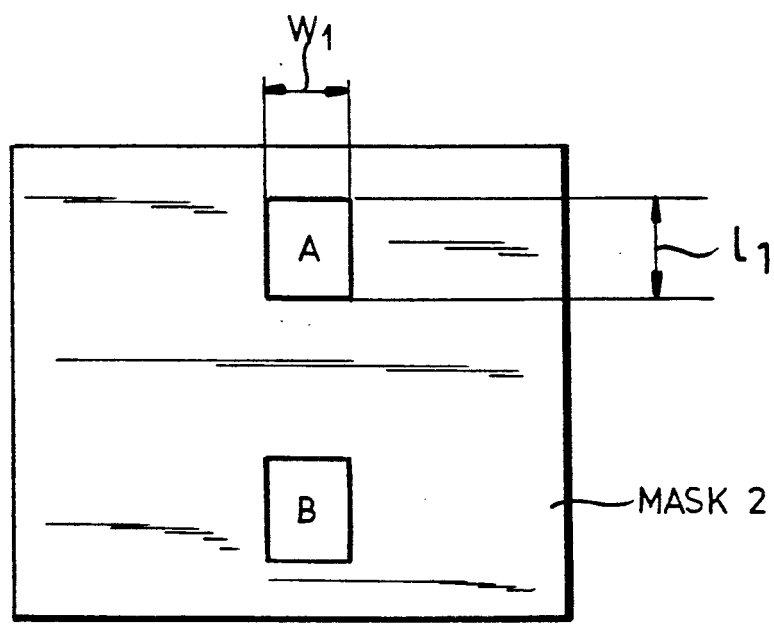
FIG. 2a is a plan view of a mask for use in fabricating the SQUID in accordance with a method described in this application.
Figure 2B:
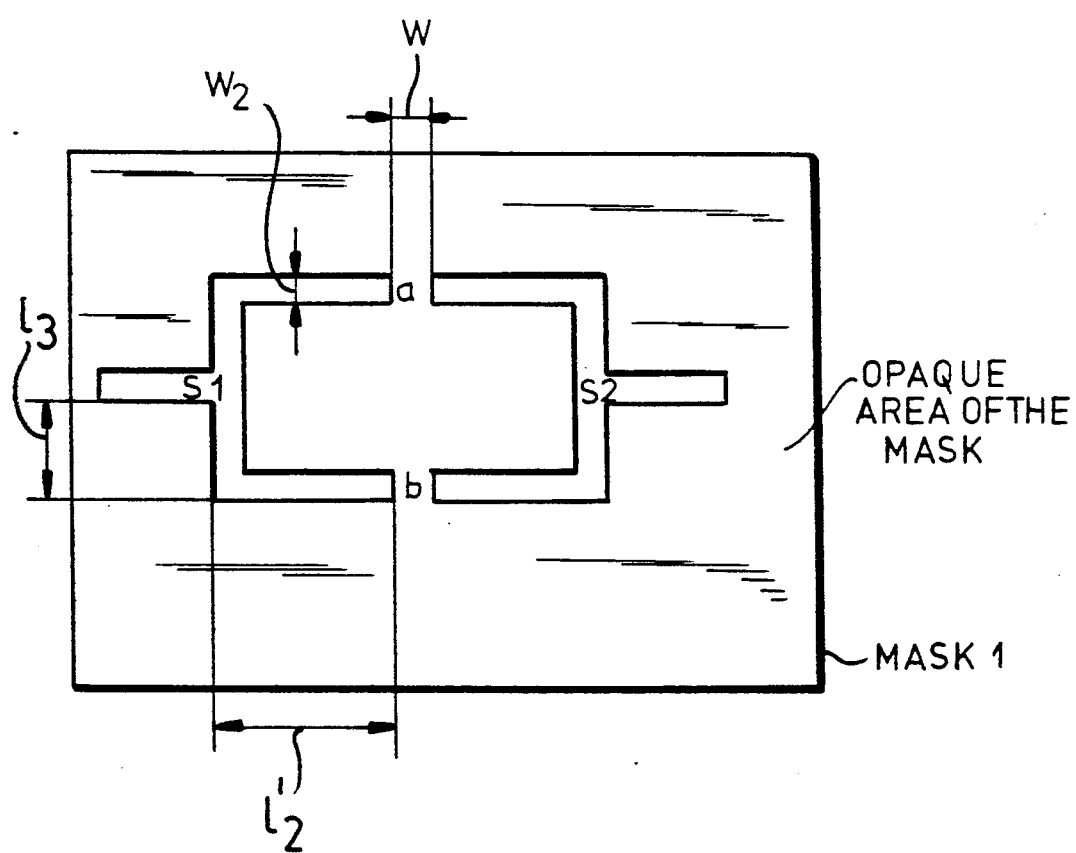
FIG. 2b is a plan view of another mask utilized in a further step of the method.

In the practice of my new invention, two photolithographic masks, 1 and 2 as shown in FIGS. 2a and 2b, are prepared by methods already known in the existing art. The various dimensions w1, w2, l1, l2 (FIG. 1) are chosen appropriate to the intended application of the superconductor quantum interference device. For nondestructive evaluation of metals, w may be of the order of 0.1-1 mm, and w1, shown in FIG. 1, is the width of the insulator unctions between the superconducting strips S1,S2 (FIG. 1). This said width is of the order of 0.4-1.3 mm. Note that item l1 (FIG. 2) is larger than w2 by ~0.5-1 mm. The separation, w, between the two lines of the mask in FIG. 2b is related to W1 by:

$$l'_2 + W/2 = l_2 + W1/2$$

l'2 is shown in FIG. 2b.

I have found that the superconductor quantum interference devices can be fabricated by following a series of subsequent procedures. The substrates may be chosen from SrTiO$_3$ or Al$_2$O$_3$ or sapphire, ZrO$_2$. All of these have to be coated with MgO, using methods known in the prior art (such as sputtering or laser evaporation). The said coated substrate, on which the superconductor quantum interference device is to be fabricated, is next spin-coated with a selected positive photo-resist. By using the mask of FIG. 2a and employing a standard photolithographic technique, areas A and B are then imprinted on the substrate. The next step involves using an argon plasma sputtering technique of the existing art to form a thin layer of about 2.5 micron thickness, selected from either SiO$_2$, SiN or MgO. Said layer is deposited onto the substrates. The substrate is then cleaned with hot acetone so that photoresist and the SiO$_2$ layer, which lies outside of areas A and B, are washed away. Next, the substrate is again spin-coated with a negative photoresist to a 2-micron thickness. The rectangular lines, S1, S2 of Mask 1 (see FIG. 1), where the final high-T$_c$ superconducting microstrip lines will appear, are imprinted on the substrate by photolithographic techniques already known in the art. To do this, mask 1 is placed on the substrate so that spaces a and b between two superconducting strips fall on the insulating areas A and B. The area of the rectangular strips have under neath the insulating MgO layer.

To construct high T$_c$ superconducting striplines or microstriplines onto these rectangular lines, S1 and S2, the techniques of fabrication of high-T$_c$ superconducting thin films and high-T$_c$ superconducting microstrip lines are followed by the author in the patents see the applicant's copending application Ser. No. 07/300,283 (Jan. 19, 89). Examples of such techniques are given in Appendix I and Appendix II. When the high-T$_c$ superconducting thin film strips are formed and finished, we have a superconductor quantum interference device of the structure as shown in FIG. 1.

Figure 4:
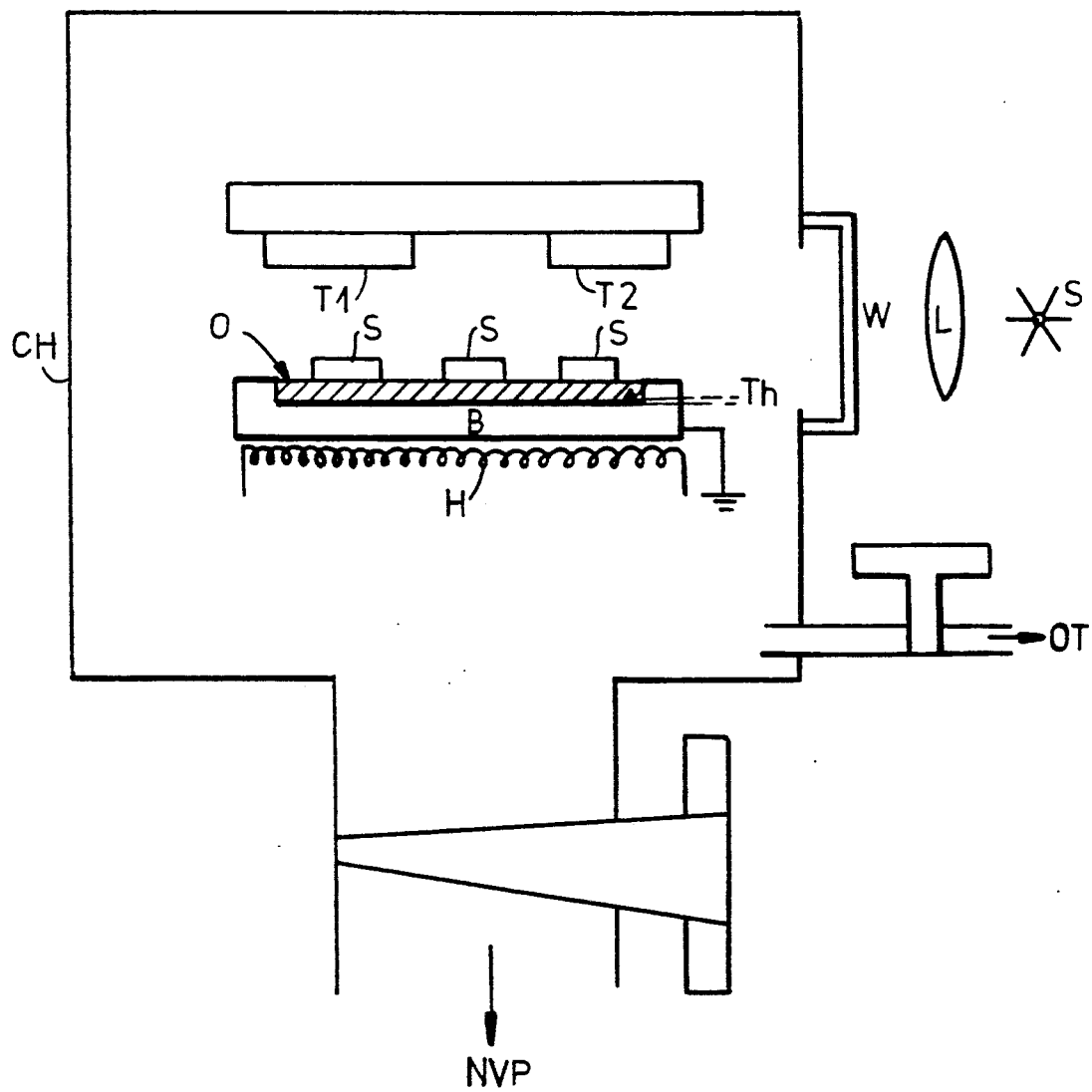
FIG. 4 is a diagrammatic cross section through another apparatus for this purpose.

A final protective layer of polymers, for protection against environmental attack, is developed on the outside of the high-T$_c$ thin film by removing all gases from the chamber in FIG. 4 and introducing CHF$_3$ gas at 100-120 Pa pressure and processing the plasma at 0.15-0.25 W/cm$^2$. This can be followed for the SQUID made by the second technique as well.

Figure 3:
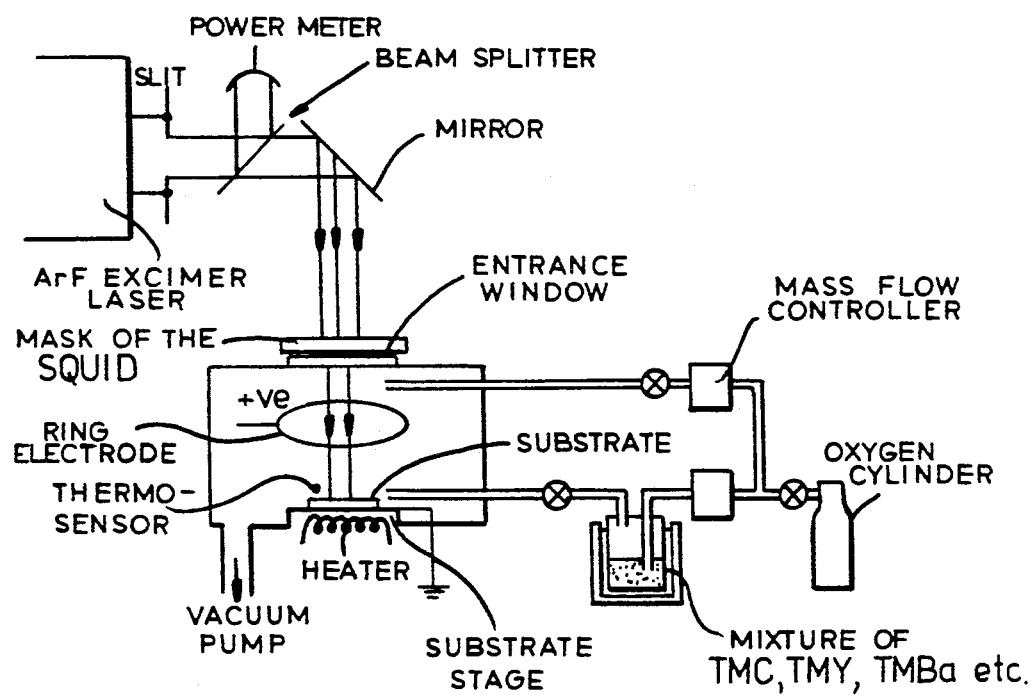
FIG. 3 is a diagrammatic elevational view and flow diagram of an apparatus for use in making a SQUID.

I describe another novel method of invention by which the the SQUID circuit can be fabricated in a simple way as schematically shown in FIG. 3. As before, the mask for the SQUID of proper design is prepared. In this mask the high-T$_c$ superconducting lines are shown as transparent to the incident light (UV) and the insulating junctions are opaque. The mask is positioned as shown in FIG. 3 and exposed to ArF excimer laser light. The laser light passes through the transparent portion of the mask and enters the chambers C. In the chamber C the substrate on which high-T$_c$ SQUID is placed on the substrate stage as shown. This substrate is coated with insulating materials like MgO, SiO$_2$, SrTiO$_3$ about 1-3 micron thick. The substrates can be chosen as mentioned earlier. It is heated to 200° C. The substrate stage is grounded as shown in FIG. 3. A ring electrode creates oxygen plasma when connected to about 1000 V in a glow discharge. Oxygen gas from the cylinder (FIG. 3) passes through the mixture containing stoichiometric ratio of TMC, TMY and TMBa. TMC stands for trimethyl copper; TMY stands for trimethyl yttrium and TMBa stands for trimethyl barium. These are liquids at room temperature but vaporize easily when a gas such as helium or argon passes through the liquid. The mixture is such that it contains the ratio of the metals say Y, Ba and Cu in the same ratio as they appear in a high-T$_c$ superconductor ceramic composition.

The pressure of the vapor mixtures in the chamber is controlled by regulating the oxygen flow as shown. The ArF excimer laser pulse should be around 8-12 ms repetition rate around 100-120 pps. Laser light then reacts photochemically with the vapors and deposits metals from the vapor on to the substrate. It may also deposit same on the entrance window. Therefore oxygen is caused to flow over the window in order to prevent blocking of the window by the deposited metals and vapors. If the oxygen pressure is around 50-100 m torr then diffusion of the deposited metals outside the projections corresponding to the transparent lines can be minimized. This will lead to writing of fine metal lines of the uniform and stoichiometric mixture of three metals say Y, Ba and Copper. After depositing the metal film of appropriate thickness which depends on vapor pressure, laser light intensity, pulse width, pulse rate and substrate temperature, the flow of TMC, TMY and TMBa vapors are discontinued. The oxygen flow is still maintained and oxygen plasma between the ring electrode and the substrate stage is created by applying dc potential of the order of 300-1000 volts depending on oxygen pressure. A typical oxygen pressure could be around 1 m torr. The substrate temperature may be raised to about 400° C. The annealing of the said deposited metal films would make the films high-$T_c$ superconducting in about 30-60 minutes. Alternately if pure oxygen is used the annealing temperature of the films has to be much higher (~900°-950° C.) and annealing time longer (4-8 hrs). This process can be improved by those skilled in the art (by controlling the oxygen pressure) to suppress completely any probable diffusion of the photolytic metallic fragments on to the neighboring microstrip lines. This process is very efficient and cost effective.

By this technique of direct laser writing of microstrip superconducting lines SQUIDs can be prepared without going through details of photolithographic processes and thus will save considerable time and labor.

There is a variation of the above techniques which may also be suitably utilized for making high-$T_c$ SQUID. This is based on creating insulating area within the high-$T_c$ superconducting elements by controlled proton bombardments as in the art.

It should be noted that using either the first or the second technique, initially one needs to deposit a loop (which could be rectangular or circular) of all high-$T_c$ superconducting microstrip lines (i.e., no insulating junction initially. The entire rectangular arms (in FIG. 1) would be made of high-$T_c$ superconductors and no gap). Then one suitable area within this loop can be rendered insulating by proton bombardment. Then one would have high-$T_c$ rf SQUID. If two such identical areas are rendered insualting by proton bombardments then there would be a dc SQUID.

In this process of thin film fabrication, the starting material is a pellet of said 'ALY' containing M, B and Cu in the atomic ratio 1:2:3 kept as target T1 (referred to FIG. B). Thin films of M(say Y), B(say Ba) and Cu in the atomic ratio 1:2:3 will be deposited on to the substrate 'S' kept on the metal base plate B (referred to FIG. B) by sputtering from targets T1 or T2 (usual standard sputtering technique will be used). Intense ultra violet light will be let in through the quartz window W into the chamber CH to create substantial ozone during the oxygen plasma annealing.

The thin films will be subjected to either the process of Appendix II and then Process A2 mentioned below or only process A2. This method will save considerably the processing time (~24 hrs) as required in the preparation of the starting material green phase YBCuO$_x$ compound or the black high-$T_c$ superconductor, before producing the thin film in the currently employed methods. Moreover metals will be easier to be evaporated to a uniform thin film than the high-$T_c$ oxide ceramics. Using the metal pellet 'ALY' method, the evaporation is termed as Stoichiometric co-deposition of composite metallic films. This metal pellet ('ALY') evaporation method will overcome any lack of stoichiometry (which is a major problem in the currently available techniques) in the composite metallic films. Which will be close to epitaxial in nature by the methods described above.

If the film deposition could be controlled very slowly in presence of oxygen-plasma and or ozone at 100 mtorr pressure while the substrates are maintained at 200°-400° C., the films are expected to become partially superconducting and thus reducing the post annealing operation time considerably.

Alternately techniques already in the art of making high-$T_c$ superconducting films could be used for depositing thin films for SQUIDs.

Figure 5:
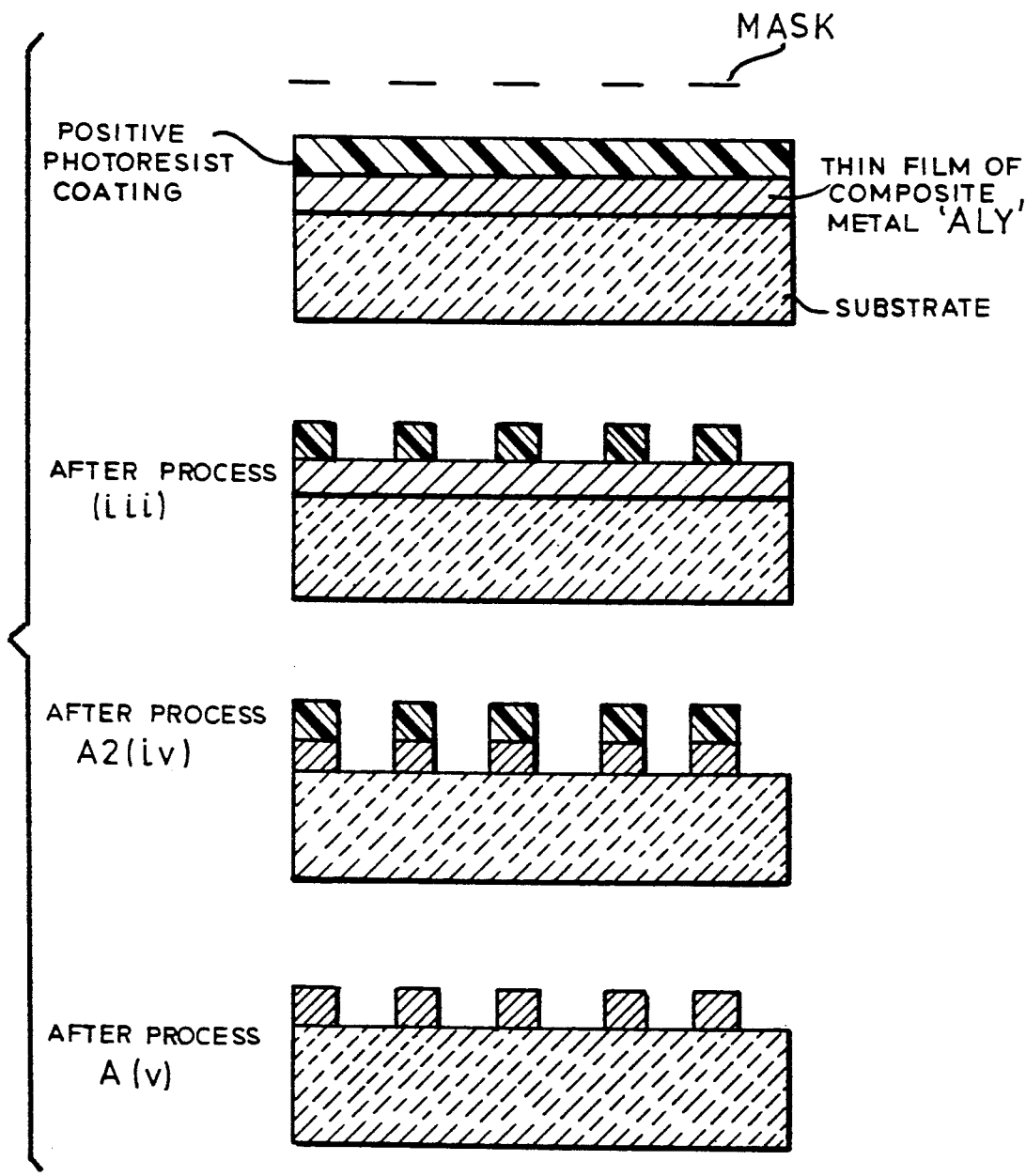
FIG. 5 is a cross sectional view showing successive steps in a process for making a SQUID.

After the thin film is deposited on a particular substrate, then desired microstrips patterns (this needs to be built on a mask photolithographic mask 'M') will be formed on the 'ALY' thin film using standard UV photolithography. The sequential processes involved in this are shown in FIG. 5. This standard UV photolithography consists of (i) coating the thin film with a uniform layer of 2-3 micron of positive photoresists by 'Spin' method. It will be pre-baked for 10-15 minutes at 60° C. (ii) Placing the mask 'M' (containing the desired circuit say high-$T_c$ SQUID) on it, the film will be allowed to be exposed to intense UV light for time ranging from 60-300 seconds, depending on the type of photoresist, its thickness, pre-bake condition and developing solution etc. (iii) The patterns then will be developed by dipping in a particular developer such as TMD-250 etc. The microstrips patterns of photoresist will then be formed. The film will be post baked for 60-90 minutes at 90° C. (iv) The metallic area outside the photoresist pattern is not desired and will be dissolved in proper etching solution which would be 1-1.5 (N) HCl at 70° C. Then the microstrips pattern of the 'ALY' material will be formed. However at this stage they will remain coated with photoresist. (v) This residual photoresist will be eliminated by thorough cleaning with acetone, isopropyl alcohol and deionized water. Then at the end we shall have the desired microstrips of the metallic alloy 'ALY'. As said before this alloy has the stoichiometric atomic ratio of Y, Ba and Cu as 1:2:3.

POST FILM DEPOSITION PROCESSES OR PROCESS A2.

The substrates with the resulting thin film will be subjected to either of the following post operations:

In the cases the thin films on the substrates are prepared by oxygen plasma sputtering or magnetron sputtering from a target of the metallic alloy 'ALY' or high-$T_c$ superconductors MB$_2$Cu$_3$O$_{7-x}$, as in process B, they can be post plasma annealed in the same chamber of FIG. 4 with the target T1 switched to the etching mode i.e., the potentials will reversed on T1 and B (B would be +ve). The substrates will be heated to ~500° C. by heating coils H kept below the bottom the base plate B (FIG. B) on which substrates are kept (temperature would be measured by thermocouple 'TH') where the substrates are kept. The bottom plate B will be maintained at 400-1000 volt +ve with respect to the top electrode plate and then oxygen plasma at 100-50 mtorr pressure will be created inside the chamber either by rf-induction or usual glow discharge technique. Oxygen plasma in presence of substantial ozone (created by intense UV light source 'S') will enhance the superconducting reaction rate and a much reduced temperature of operation is possible. This oxygen plasma/ozone will create an uniform distribution of $Cu^{2+}$ and $Cu^{3+}$ throughout the film and oxygen concentration very close to '7', which is necessary for best superconducting properties. Moreover the reduced temperature of operation and considerably reduced processing time will prevent considerably the substrate diffusion into the film; in other words, the interfacial chemical reactions between the substrate and the film, which degrades the quality of the thin films in many cases, will be negligible. Thus very high quality thin films of high-$T_c$ superconductors can be consistently produced.

Figure 6:
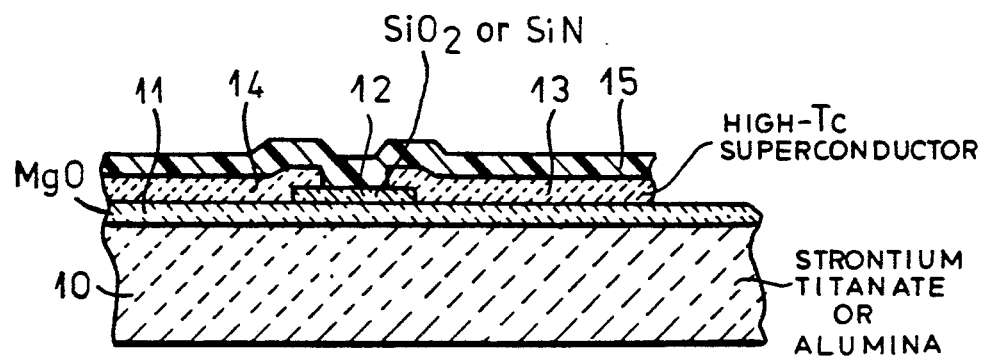
FIG. 6 is a cross sectional view through the SQUID at a region of a junction and drawn to a much larger scale.

The strontium titanate or alumina substrate in FIG. 6 is here shown to be provided with a coating 11 of magnesium oxide. The two thin-film arms 13 and 14 of the high critical-temperature superconductor have been represented as being separated by a thin film 12 of silicon dioxide or silicon nitride to form, in effect, a Josephson junction so that the two Josephson junctions 23 and 24 (FIG. 6) can constitute the superconductor quantum interferometer device as will be described in further detail in connection with FIG. 7.

The insulating layer 15 of polytetrafluoroethylene, for example, formed in the manner described, can cover the entire device.

The high critical-temperature superconductor may be any of those described above and can be applied utilizing the masking approaches which have also been detailed previously.

Figure 7:
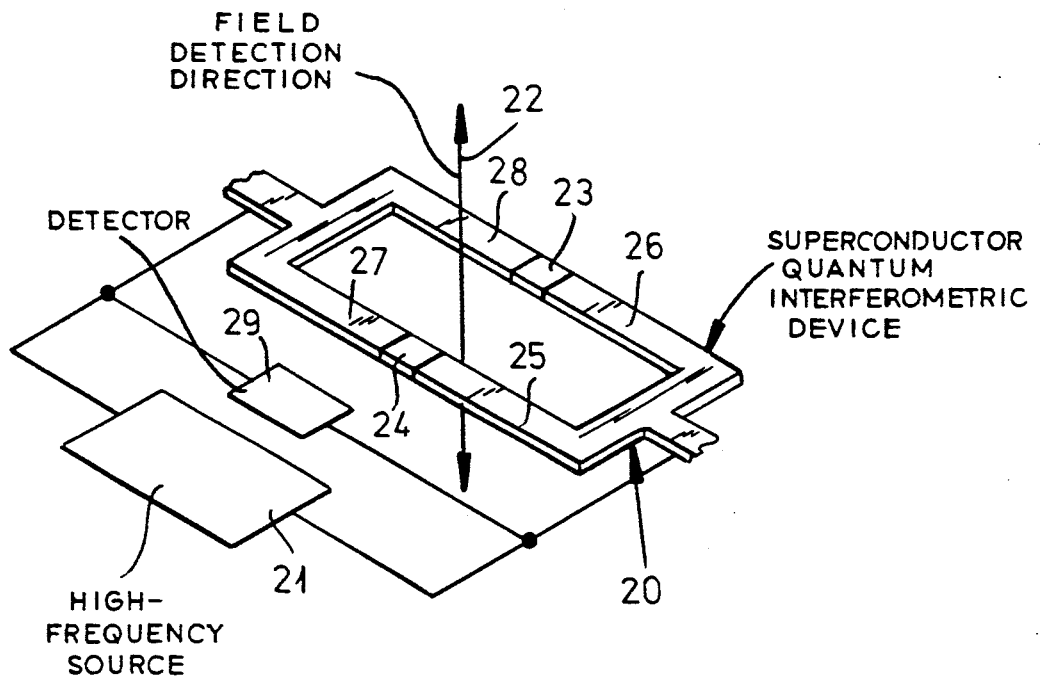
FIG. 7 is a circuit diagram illustrating a SQUID connected to detect variations in magnetic flux.

As can be seen from FIG. 7, the superconductive quantum interferometer device can be energized by a high-frequency source 21 which applies a modulated high-frequency signal to the two U-shaped semiconductive films 20 which form the Josephson junctions at 23 and 24 between the corresponding arms 25, 26 and 27, 28, respectively, so that variations of the magnetic flux in the field detection direction represented by arrow 22 can be detected by the detector 29 in accordance with conventional SQUID (superconductive quantum interferometer) techniques.

I claim:

1. A superconductive quantum interferometric device for sensing a characteristic of a magnetic field, comprising:
    a substrate having a surface, said substrate being selected from the group which consists of strontium titanate, aluminum oxide, sapphire, $ZrO_2$ and mixtures thereof;
    a coating of MgO on said surface of said substrate;
    two identical thin-strip films of a high-critical temperature superconductor on said coating, each of said films having a pair of mutually parallel arms in the form of superconductor strips extending toward and aligned with superconductor strips forming corresponding arms of the other thin-strip film, and a crossbar strip connecting the arms of each thin-strip film at right angles to said arms, said high-critical-temperature superconductor being selected from the group which consists of
    yttrium-barium-copper-oxides,
    bismuth-strontium-calcium-copper-oxides,
    thallium-calcium-copper-oxides,
    thallium-barium-copper-oxides,
    thallium-barium-calcium-copper-oxides,
    barium oxide:potassium oxide:bismuth oxides, and
    calcium oxide:zinc oxide: iron oxides.; and
    insulating films on said coating between corresponding free ends of said arms thin-strip films, said insulating films being composed of a material selected from the group which consists of silicon dioxide, silicon nitride, magnesium oxide and mixtures thereof.

2. The superconductive quantum interferometric device defined in claim 1, further comprising a protective coating of an insulating material on said films and said substrate.

3. The superconductive quantum interferometric device defined in claim 4 wherein the insulating films have thicknesses of substantially 0.005 to substantially 5.0 microns, and widths between the respective arms of substantially 0.005 to substantially 5.0 mm.

4. The superconductive quantum interferometric device defined in claim 6 wherein said coating of insulating material is composed of polytetrafluoroethylene.

* * * * *